United States Patent [19]
Nilssen

[11] Patent Number: 5,343,123
[45] Date of Patent: Aug. 30, 1994

[54] SERIES-RESONANT INVERTER BALLAST

[76] Inventor: Ole K. Nilssen, Caesar Dr., Barrington, Ill. 60010

[21] Appl. No.: 933,891

[22] Filed: Aug. 24, 1992

Related U.S. Application Data

[60] Continuation of Ser. No. 798,869, Nov. 25, 1991, abandoned, which is a continuation of Ser. No. 357,797, May 30, 1989, abandoned, which is a continuation-in-part of Ser. No. 20,478, Mar. 2, 1987, Pat. No. 4,857,806, which is a continuation-in-part of Ser. No. 262,542, May 5, 1981, Pat. No. 4,895,943, which is a division of Ser. No. 178,107, Aug. 14, 1980, Pat. No. 4,902,516, which is a continuation-in-part of Ser. No. 973,741, Dec. 28, 1978, which is a continuation-in-part of Ser. No. 890,586, Mar. 20, 1978, Pat. No. 4,184,128.

[51] Int. Cl.$^5$ .............................................. H05B 37/02
[52] U.S. Cl. ...................................... 315/219; 315/57; 315/62; 315/212; 361/674; 362/221; 362/216
[58] Field of Search ................ 361/377; 362/221, 216; 315/57, 62, DIG. 7, 219, 212; 331/113 A

[56] References Cited

U.S. PATENT DOCUMENTS

| | | | |
|---|---|---|---|
| 3,448,335 | 6/1969 | Gregory et al. | 315/DIG. 7 |
| 3,706,052 | 12/1972 | Canup | 331/113 A |
| 4,093,893 | 6/1978 | Anderson | 315/48 |
| 4,161,021 | 7/1979 | George, Jr. | 362/252 |
| 4,184,128 | 1/1980 | Nilssen | 315/DIG. 2 |
| 4,244,013 | 1/1981 | Wotowiec | 362/216 |
| 4,251,752 | 2/1981 | Stolz | 315/DIG. 7 |
| 4,279,011 | 7/1981 | Nilssen | 331/113 A |
| 4,311,942 | 1/1982 | Skeist et al. | 315/62 |
| 4,353,007 | 10/1982 | Moerkens et al. | 315/62 |
| 4,370,600 | 1/1983 | Zansky | 315/DIG. 7 |
| 4,496,878 | 1/1985 | Nilssen | 362/216 |
| 4,677,345 | 6/1987 | Nilssen | 315/209 R |
| 4,857,806 | 8/1989 | Nilssen | 315/72 |

OTHER PUBLICATIONS

Dale et al. "Conversion of incandescent lamp sockets to fluorescent in the home market", Lighting & Design Application Mar. 1976 pp. 18–23.

*Primary Examiner*—Robert J. Pascal
*Assistant Examiner*—Reginald A. Ratliff

[57] ABSTRACT

A half-bridge inverter is powered from an ordinary electric utility power line by way of a full wave rectifier-filter means. The high frequency voltage output of the inverter is loaded with a series-combination of a tank inductor and a tank capacitor, with a fluorescent lamp being connected in parallel with the tank capacitor. The ON-time of each of the inverter's two transistors is shorter than half the period of the high frequency voltage; thereby preventing the two transistors from conducting simultaneously; thereby, in turn, protecting the inverter from self-destruction in case of lamp failure.

18 Claims, 1 Drawing Sheet

SERIES-RESONANT INVERTER BALLAST

Instant application is a continuation of Ser. No. 07/798,869 filed Nov. 25, 1991, now abandoned; which is a continuation of Ser. No. 07/357,797 now abandoned filed May 30, 1989; which is a continuation-in-part of Ser. No. 07/020,478 filed Mar. 2, 1987, now U.S. Pat. No. 4,857,806; which is a continuation-in-part of Ser. No. 06/262,542 filed May 5, 1981, now U.S. Pat. No. 4,895,943 which is a division of Ser. No. 06/178,107 filed Aug. 14, 1980, now U.S. Pat. No. 4,902,516.

Instant application is also a continuation-in-part of Ser. No. 07/717,860 filed Jun. 19, 1991, now U.S. Pat. No. 5,166,578.

Instant application is also a continuation-in-part of Ser. No. 07/743,216 filed Aug. 9, 1991, now U.S. Pat. No. 5,164,637.

Instant application is also a continuation-in-part of Ser. No. 07/887,427 filed May 21, 1992, now U.S. Pat. No. 5,214,356.

Instant application is also a continuation-in-part of Ser. No. 07/995,229 filed Oct. 1, 1992, now U.S. Pat. No. 5,233,270.

FIELD OF INVENTION

Instant invention relates to inverter-type fluorescent lamp ballasting means operable to be powered from an ordinary electric utility power line.

SUMMARY OF THE INVENTION

Objects of the Invention

An object of the present invention is that of providing a reliable cost-effective fluorescent lamp ballasting means.

This as well as other objects, features and advantages of the present invention will become apparent from the following description and claims.

BRIEF DESCRIPTION

In its preferred embodiment, instant invention comprises a half-bridge inverter powered from an ordinary electric utility power line by way of a full wave rectifier-filter means. The high frequency squarewave voltage output of the inverter is loaded with a series-combination of a tank inductor and a tank capacitor, with a fluorescent lamp being connected in parallel with the tank capacitor. The ON-time (or forward conduction period) of each of the inverter's two transistors is shorter than half the period of the high frequency voltage; thereby manifestly preventing the two transistors from conducting simultaneously; thereby, in turn, protecting the inverter from self-destruction in case of lamp failure.

DESCRIPTION OF THE PREFERRED EMBODIMENT

Figure 1:
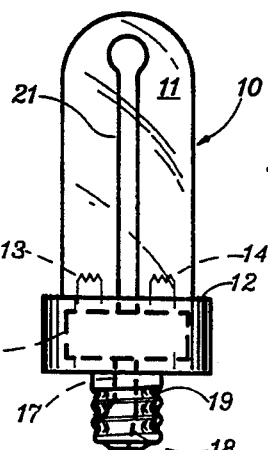
FIG. 1 schematically illustrates a compact, screw-in, self-ballasted fluorescent lamb assembly constructed on basis of the preferred embodiment of the invention.

FIG. 1 illustrates a screw-in gas discharge lamp unit 10 comprising a folded fluorescent lamp 11 secured to an integral base 12. The lamp comprises two cathodes 13, 14 which are supplied with the requisite high operating voltage from a frequency-converting power supply and ballasting circuit 16; which, because of its compact size, conveniently fits within base 12.

Circuit 16 is connected by leads 17, 18 to a screw-type plug 19 adapted for screw-in insertion into a standard Edison-type incandescent lamp socket at which ordinary 120 Volt/60 Hz power line voltage is available.

Figure 2:
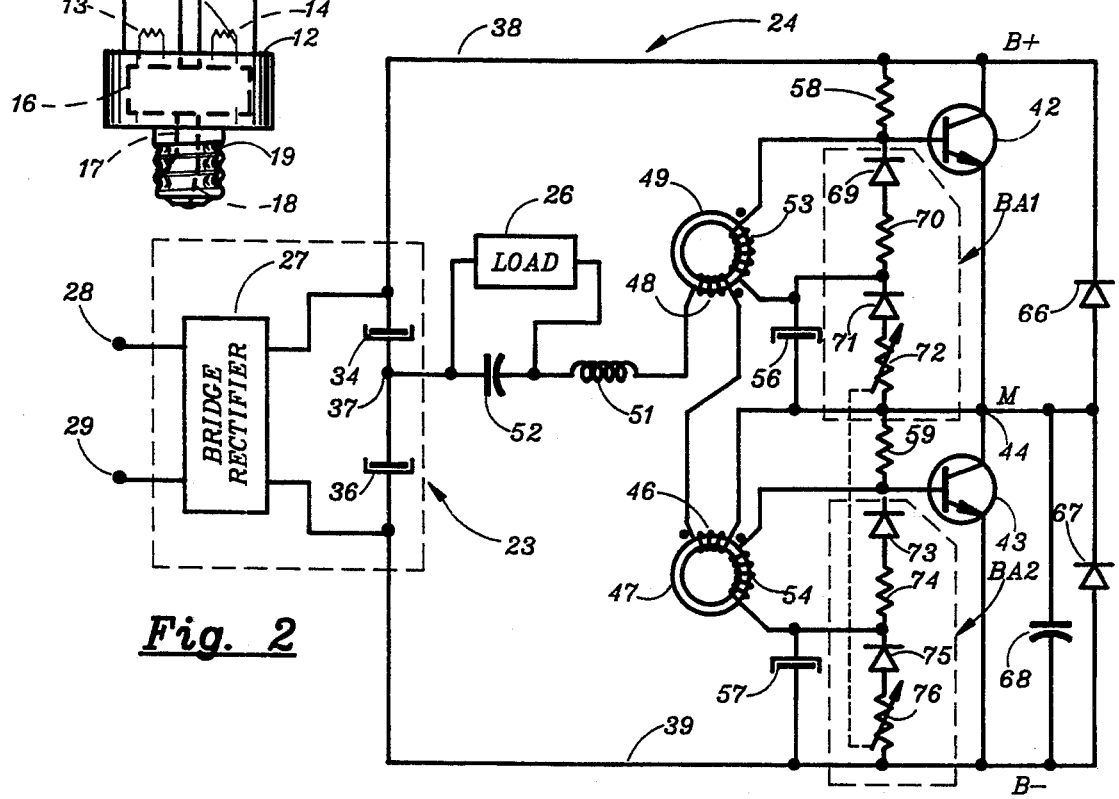
FIG. 2 is a schematic diagram of the preferred embodiment of the invention.

In FIG. 2, a power supply 23 is connected with the 120 Volt/60 Hz power line voltage and provides a center-tapped DC output voltage for supplying a high-efficiency half-bridge inverter circuit 24. The inverter circuit is operable to provide a high-frequency (20-30 kHz) high-magnitude current-limited voltage to a load 26, which actually represents fluorescent lamp 11 of FIG. 1.

Power supply 23 comprises bridge rectifier 27 which connects with 120 Volt/60 Hz power line terminals 28, 29 and provides full-wave rectified power line voltage to two series-connected filter capacitors 34, 36; which filter capacitors are: i) connected together at a center-tap 37, and ii) connected between a positive B+ bus 38 and a negative B- bus 39.

Inverter circuit 24 is a half-bridge inverter comprising transistors 42, 43 connected in series between the B+ bus and the B- bus. The collector of transistor 42 is connected to B+ DUS 38, the emitter of transistor 42 and the collector of transistor 43 are connected to a midpoint line 44 ("M"), and the emitter of transistor 43 is connected to the B- bus 39.

Midpoint line 44 is connected to center-tap 37 through a primary winding 46 of a toroidal saturable core transformer 47, a primary winding 48 on an identical transformer 49, a tank inductor 51 (L) and a series-connected tank capacitor 52 (C) Inductor 51 and capacitor 52 are energized upon alternate transistor conduction in manner to be described later. Load 26 is connected in parallel with capacitor 52.

Drive current to the base terminals of transistors 42 43 is provided by secondary windings 53, 54 of transformers 47, respectively. Winding 53 is also connected to midpoint line 44 through a bias capacitor 56, while winding 54 is connected to the B- bus 39 through an identical bias capacitor 57. The base terminals of transistors 42 and 43 are also connected to lines 38 and 44 through bias resistors 58 and 59, respectively. Shunt diodes 66 and 67 are connected across the collector-emitter terminals of transistors 42 and 43, respectively. A capacitor 68 is connected across the collector-emitter terminals of transistor 43 to restrain the rate of voltage rise across those terminals.

A first optional biasing arrangement BA1 comprises a diode 69 connected with its cathode to the base of transistor 42 and with its anode to the cathode of a diode 71 by way of a resistor 70; the anode of diode 71 is connected with the emitter of transistor 42 by way of a resistor 72; the cathode of diode 71 is connected with the un-dotted side of secondary winding 53 of transformer 49. A second optional biasing arrangement BA2 comprises a diode 73 connected with its cathode to the base of transistor 43 and with its anode to the cathode of a diode 75 by way of a resistor 74; the anode of diode 75 is connected with the emitter of transistor 43 by way of a resistor 76; the cathode of diode 76 is connected with the un-dotted side of secondary winding 54 of transformer 47.

Figure 3A:
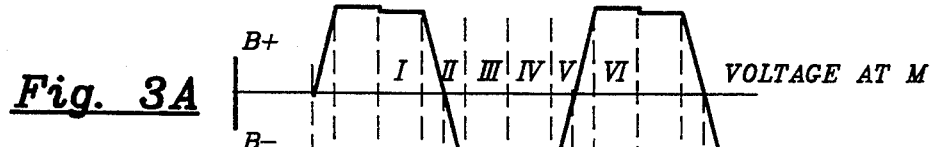
FIGS. 3(a-d) illustrates the waveforms of various voltages and currents associated with the ballasting circuit of FIG. 2.
Figure 3B:
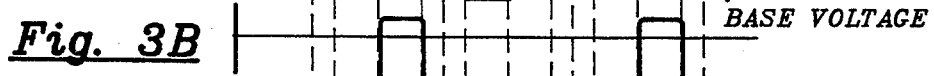
Figure 3C:
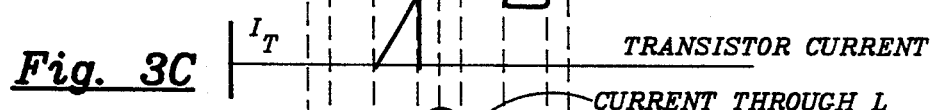
Figure 3D:
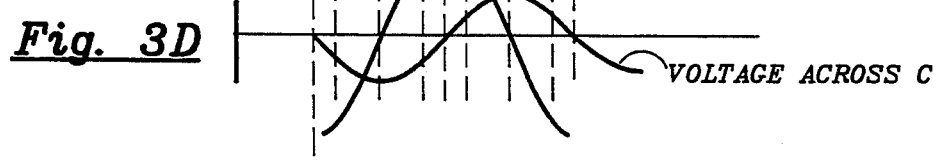

The operation of the circuit of FIG. 2 can best be understood with additional reference to FIG. 3, which illustrates significant portions of the waveforms of the voltage at midpoint M (FIG. 3A), the base-emitter voltage on transistor 42 (FIG. 3B), the current through transistor 42 (FIG. 3C), and the capacitor 52 voltage and the inductor 51 current (FIG. 3D).

Starting at a point where transistor 42 first starts to conduct, current flows from the B+ bus 38 through windings 46 and 48 and inductor 51 to charge capacitor 52 and returns to the B+ bus through capacitor 34 (refer to the time period designated I in FIG. 3). When the saturable transformer 49 saturates at the end of period I, drive current to the base of transistor 42 will terminate, causing voltage on the base of the transistor to drop to the negative voltage stored on bias capacitor 56 in a manner to be described, causing this transistor to become non-conductive. As shown in FIG. 3c, current-flow in transistor 43 terminates at the end of period I.

However, since the current flowing through inductor 51 cannot change instantaneously, this current will now continue to flow from the B− bus 39 through capacitor 68, eventually causing the voltage at midpoint line 44 to drop to the voltage level on the B− bus (period II in FIG. 3). Thus, capacitor restrains the rate of voltage change across the collector and emitter terminals of transistor 42.

The current through inductor 51 reaches its maximum value when the voltage at midpoint line 44 is zero. During period III the current will continue to flow through inductor 51 but will be supplied from the B− bus through shunt diode 67. It will appreciated that during the latter half of period II and all of period III, positive current is being drawn from a negative voltage; which, in reality, means that energy is being returned to the power supply through a path of relatively low impedance.

When the inductor current reaches zero at the start of period IV, the current through the primary winding 46 of the saturable inductor 47 will cause a current to flow out of secondary winding 54 to cause transistor 43 to become conductive, thereby causing a reversal in the direction of current through inductor 51 and capacitor 52. When transformer 47 saturates at the end of period IV, the drive current to the base of transistor 43 terminates and the current through inductor 51 will supplied through capacitor 68, causing the voltage at midpoint 44 to rise (Period V). When the voltage at the midpoint line M reaches the voltage on the B+ bus, the current will then flow through shunt diode 66 (period VI). The cycle is then repeated.

As seen in FIG. 3, saturable transformers 47, 49 provide transistor drive current only after the current through inductor 51 has diminished to zero. Further, the the transistor drive current is terminated before the current through inductor has reached its maximum amplitude. This coordination of base drive current and inductor current is achieved because of the series-connection between the inductor 51 and the primary windings 46, 48 of saturable transformers 47, 49, respectively.

The series-connected combination of inductor 51 and capacitor 52 is energized upon the alternate conduction of transistors 42 and 43. With a large value of capacitance of capacitor 52, very little voltage will be developed across its terminals. As the value of this capacitance is decreased, however, the voltage across this capacitor will increase. As the value of capacitor 52 is reduced to achieve resonance with inductor 51, the voltage on the capacitor will rise and become infinite in a loss-free circuit operating under ideal conditions.

It has been found desirable to regulate the transistor inversion frequency, determined mainly by the saturation time of saturable transformers 47, 49, to be equal to or higher than the natural resonance frequency of the inductor ana capacitor combination in order to provide a high voltage output to external load 26.

Due to so-called Q-multiplication, a high-magnitude voltage develops across capacitor 52 as the transistor inversion frequency approaches the natural resonance frequency of one series-combination of inductor 51 and capacitor 52.

When inverter circuit 24 is used in the self-ballasted fluorescent lamp of FIG. 1, it has been found that the inversion frequency may be about equal to the natural resonance frequency of the series L-C tank circuit consisting of inductor 51 and capacitor 52. However, if the capacitance value of capacitor 52 is reduced below the point of resonance, unacceptably high transistor currents will result and transistor burn-out will occur.

The sizing of capacitor 52 is determined by the particular application of inverter circuit 24; but, as long as the combined load presented to the output of inverter transistors 42, 43, has an effective inductance value sufficient to provide adequate energy storage for self-sustained transistor inverter action, the current-feedback provided by saturable transformers 47, 49 will effect alternate transistor conduction without the need for additional voltage-feedback.

Because the voltages across transistors 42, 43 are relatively low (due to the absolute voltage-clamping effect to capacitors 34, 36), the half-bridge inverter 24 is very reliable. The absence of switching transients minimizes the possibility of transistor burn-out.

Inverter circuit 24 comprises means for supplying reverse bias to the conducting transistor upon saturation of its associated saturable transformer. For this purpose, capacitors 56 and 57 are charged to negative voltages as a result of reset currents flowing into secondary windings 53, 54 from the bases of transistors 42, 43, respectively. This reverse current rapidly turns off a conducting transistor to increase its switching speed and to achieve high inverter switching efficiency.

When a transistor base-emitter junction is reversely biased, it exhibits the characteristics of a Zener diode, having a reverse breakdown voltage on the order of 8 to 14 Volt for transistors typically used in high-voltage inverters.

Since load 26 comprises a fluorescent lamp, the maximum magnitude of the voltage across capacitor 52 will be limited by the lamp's ignition and operating characteristics, thereby effectively preventing voltages across inductor 51 and capacitor 52 from ever reaching destructive levels.

The above-presented explanation of the operation of the FIG. 2 inverter circuit was based on the two biasing arrangements (BA1 and BA2) being non-connected.

With these biasing arrangements actually connected as indicated, the inverter's operation will become independent of the exact magnitudes of the transistors' base-emitter Zenering voltages. Instead, the magnitude of the negative bias voltage established on each of capacitors 56 and 57 can now be chosen by choice of resistance value of resistor 72 and/or resistor 76: the lower the resistance value, the lower the magnitude of the associated negative bias voltage; and, in turn, the longer the transistors' ON-time, the lower the inverter's self-oscillating frequency, and the higher the magnitudes of the inverter's output current and power.

By providing for means whereby the resistance values of resistors 72 and 76 can be manually adjusted (in tandem and/or individually), the power provided to the fluorescent lamp may be correspondingly adjusted: the lower the resistance values, the more power provided to the lamp.

Moreover, due to the negative feedback effect inherently provided by resistors 72 and 74, the inverter may be made to operate safely even with the fluorescent lamp being non-connected.

This negative feedback effect is due to the fact that, as the magnitude of the current flowing through the L-C circuit increases, the magnitudes of the drive currents provided to the transistors' bases increase, and the magnitudes of the currents drawn out of capacitors 56 and 57 increase correspondingly; which, in turn, increases the magnitudes of the negative bias voltages present on these capacitors to the point where the magnitudes of the currents flowing through resistors 72 and 76 equal those of the increased base currents. However, the increased negative bias voltages will inherently shorten the transistors' ON-times; which, in turn, will increase the inverter frequency, thereby reducing the inverter's output current; etc. In other words, the indicated biasing arrangements provide for an automatic self-limiting of the magnitude of the inverter's output current.

Additional Explanations and Comments a) With commonly available components, inverter circuit 24 can be made to operate efficiently at any frequency between a few kHz to perhaps as high as 50 kHz. However, for various well-known reasons (i.e., eliminating audible noise, minimizing physical size, and maximizing efficiency), the frequency actually chosen for the lamp unit of FIG. 1 was in the range of 20 to 30 kHz.

b) The fluorescent lighting unit of FIG. 1 could be made in such manner as to permit fluorescent lamp 11 to be disconnectable from its base 12 and ballasting means 16. However, if powered with normal line voltage without its lamp load connected, frequency-converting power supply and ballasting circuit 16 is apt to self-destruct.

To avoid such self-destruction, arrangements can readily be made whereby the very act of removing the load automatically establishes a situation that prevents the possible destruction of the power supply and ballasting means. For instance, with the tank capacitor (52) being permanently connected with the lamp load (11)—thereby automatically being removed whenever the lamp is removed—the inverter circuit is protected from self-destruction.

c) At frequencies above a few kHz, the loam represented by a fluorescent lamp—once it is ignited—is substantially resistive. Thus, with the voltage across lamp 11 being of a substantially sinusoidal waveform (as indicated in FIG. 3d), the current through the lamp will also be substantially sinusoidal in waveshape.

d) In the fluorescent lamp unit of FIG. 1, fluorescent lamp 11 is connected with power supply and ballasting circuit 16 in the exact same manner as is load 26 connected with the circuit of FIG. 2. That is, it is connected in parallel with the tank capacitor (52) of the L-C series-resonant circuit. As is conventional in instant-start fluorescent lamps—such as lamp 11 of FIG. 1—the two terminals from each cathode are shorted together, thereby to constitute a situation where each cathode effectively is represented by only a single terminal. However, it is not necessary that the two terminals from each cathode be shorted together; in which case—for instant-start operation —connection from a lamp's power supply and ballasting means need only be made with one of the terminals of each cathode.

e) It is noted that the transistor's ON-time is shorter than half the period of the inverter's high frequency squarewave voltage output; which voltage output is illustrated by FIG. 3A.

The fact that each of the transistors' ON-times is shorter than half the period of the inverter's high frequency output voltage (or output current) is important: it inherently provides for a situation where the two transistors are manifestly prevented from conducting at the same time, thereby providing protection against circuit failure due to excess-magnitude transistor currents.

f) By adjusting the resistance values of resistors 72 and/or 76, the ON-times of the associated transistors are adjusted accordingly. For instance, by increasing the resistance value of resistor 76, the ON-time associated with transistor 43 is shortened; and, as a result, the magnitude of the current provided to the load 26 is reduced.

g) It is thought that the present invention and many of its attendant advantages will be understood from the foregoing description and that many changes may be made in the form and construction of its components parts, the form described being merely a preferred embodiment of the invention.

I claim:

1. A lamp assembly operable to be inserted into and held by an ordinary Edison-type lamp socket; the lamp socket having socket electrodes at which is provided an AC power line voltage; the lamp assembly comprising:

a gas discharge lamp having lamp terminals;

base means operable to be inserted into and held by the Edison-type lamp socket; the base means having base electrodes operable to make electrical contact with the socket electrodes; the base means also including a combination of:

(a) rectifier means connected with the base electrodes and operative, whenever the base means is indeed inserted into the Edison-type lamp socket, to provide a DC voltage at a set of DC terminals;

(b) inverter means connected with the DC terminals and operative to provide an inverter voltage from a pair of inverter terminals; the inverter voltage having a fundamental period consisting of four time segments: (i) a first time segment during which the magnitude of the inverter voltage remains at a first substantially constant level, (ii) a second time segment during which the magnitude of the inverter voltage increases in a substantially gradual manner, (iii) a third time segment during which the magnitude of the inverter voltage remains at a third substantially constant level, and (iv) a fourth time segment during which the magnitude of the inverter voltage decreases in a substantially gradual manner; the inverter means including: (i) a first transistor characterized by conducting current during the first time segment but not during more than half of the second time segment, nor during any other time, and (ii) a second transistor characterized by conducting current during the third time segment but not during more than half of the fourth time segment, nor during any other time; the duration of the first time segment being: (i) approximately equal to that of the third time segment, and (ii) distinctly shorter than half the duration of the fundamental period;

(c) current-limiting means connected between the inverter terminals and a pair of output terminals; and (d) connect means operative to connect the output terminals with the lamp terminals.

2. The lamp assembly of claim 1 wherein the first transistor is characterized by having a pair of control terminals across which is applied a control voltage having a peak-to-peak magnitude substantially larger than twice the forward voltage drop of an ordinary semiconductor junction.

3. The lamp assembly of claim 1 wherein the inverter voltage has a peak-to-peak magnitude equal to the magnitude of the DC voltage.

4. The lamp assembly of claim 1 wherein the two transistors are series-connected across the DC terminals.

5. A lamp assembly operable to be inserted into and held by an ordinary Edison-type lamp socket; the lamp socket having socket electrodes at which is provided an AC power line voltage; the lamp assembly comprising;

a gas discharge lamp having lamp terminals; and base means operable to be inserted into and held by the Edison-type lamp socket; the base means having base electrodes operable to make electrical contact with the socket electrodes; the base means also including a combination of:

(a) rectifier means connected with the base electrodes and operative, whenever the base means is indeed inserted into the Edison-type lamp socket, to provide a DC voltage at a set of DC terminals;

(b) inverter means connected with the DC terminals and operative to provide an inverter voltage from a pair of inverter terminals; the inverter voltage having a fundamental period consisting of four time segments: (i) a first time segment during which the magnitude of the inverter voltage remains at a first substantially constant level, (ii) a second time segment during which the magnitude of the inverter voltage increases in a substantially gradual manner, (iii) a third time segment during which the magnitude of the inverter voltage remains at a third substantially constant level, and (iv) a fourth time segment during which the magnitude of the inverter voltage decreases in a substantially gradual manner; the inverter means including a first transistor characterized by conducting current in its forward direction during the first time segment; the duration of the first time segment being: (i) approximately equal to that of the third time segment, and (ii) distinctly shorter than half the duration of the fundamental period; the first transistor being operative to prevent the flow of current in its forward direction during at least a significant part of each of the second and fourth time segments;

(c) current-limiting means connected between the inverter terminals and a pair of output terminals; and (d) connect means operative to connect the output terminals with the lamp terminals.

6. A lamp assembly adapted to be inserted into and held by an ordinary Edison-type lamp socket; the lamp socket having socket electrodes at which is provided an ordinary AC power line voltage; the lamp assembly comprising:

a gas discharge lamp having two lamp terminals; and base means operable to be inserted into the Edison-type lamp socket; the base means having base electrodes operable to make electrical contact with the socket electrodes; the base means including frequency-converting ballast means connected in circuit between the base electrodes and the lamp terminals; the ballast means being operative to provide an AC voltage to the lamp terminals; the ballast means being characterized by including a periodically conducting first transistor having: (i) a pair of control input terminals receiving a control signal, and (ii) a pair of output terminals across which exists a periodically varying transistor voltage; the periodically varying transistor voltage being characterized by having a fundamental period consisting of four time segments: (i) a first time segment during which the magnitude of the transistor voltage remains at a first substantially constant level, (ii) a second time segment during which the magnitude of the transistor voltage increases in a substantially gradual manner, (iii) a third time segment during which the magnitude of the transistor voltage remains at a third substantially constant level, and (iv) a fourth time segment during which the magnitude of the transistor voltage decreases in a substantially gradual manner; the transistor conducting current in its forward direction during at least part of the first time segment but not during most of the second time segment.

7. The lamp assembly of claim 6 wherein the control signal has a peak-to-peak magnitude distinctly larger than twice the forward voltage drop of an ordinary semiconductor diode junction.

8. The lamp assembly of claim 6 wherein the duration of the first time segment is distinctly shorter than half the duration of the fundamental period.

9. The lamp assembly of claim 6 wherein to current flows through the first transistor during any part of the fourth period.

10. The lamp assembly of claim 6 further characterized by including: (i) a pair of terminals across which exists a DC voltage; and (ii) a second transistor series-connected with the first transistor to form a series-combination, which series-combination being connected across the DC terminals.

11. A lamp assembly adapted to be inserted into an held by an ordinary Edison-type lamp socket; the lamp socket having socket electrodes at which is provided an ordinary AC power line voltage; the lamp assembly comprising:

a gas discharge lamp having lamp terminals; and base means operable to be inserted into and held by the Edison-type lamp socket; the base means including base electrodes operable to make electrical contact with the socket electrodes; the base means also including a sub-assembly connected in circuit between the base electrodes and the lamp terminals; the sub-assembly being functional, as long as the base electrodes do indeed make electrical contact with the socket electrodes, to provide a lamp AC voltage to the lamp terminals; the frequency of the lamp AC voltage being distinctly higher than that of the AC power line voltage; the sub-assembly being further characterized by including: (i) a pair of DC terminals across which exists a DC voltage; and (ii) two periodically conducting transistors series-connected across the DC terminals.

12. The lamp assembly of claim 11 wherein the base means is further characterized in that the absolute magnitude of the DC voltage is distincly higher than the peak absolute magnitude of the AC power line voltage.

13. The lamp assembly of claim 11 wherein the gas discharge lamp includes plural parallel-disposed cylindrically-shaped lamp-segments protruding out from the base means and is further characterized by not having any non-translucent object mounted in between the cylindrically-shaped sections.

14. The lamp assembly of claim 11 wherein: (i) the base means includes a cylindrically-shaped screw-type plug; and (ii) the gas discharge lamp includes at least one cylindrically-shaped lamp-segment having its cylindrical axis disposed parallel to the cylindrical axis of the cylindrically-shaped screw-type plug.

15. The lamp assembly of claim 11 wherein the base means includes a housing structure onto one side of which is mounted the gas discharge lamp and onto the opposite side of which is mounted a cylindrically-shaped screw-type plug screwed into the lamp socket; the screw-type plug having (i) a cylindrical axis, and (ii) a maximum screw-base diameter; the cylindrical axis constituting an axis of symmetry for the base means; which base means further characterized by having a maximum diameter no larger than about 2.5 times the maximum screw-base diameter.

16. A lamp assembly operable to be inserted into and held by an ordinary Edison-type lamp socket; the lamp socket having socket electrodes at which is provided an AC power line voltage; the lamp assembly comprising:

a gas discharge lamp having lamp terminals; and base means operable to be inserted into and held by the Edison-type lamp socket; the base means having base electrodes operable to make electrical contact with the socket electrodes; the base means also including a combination of:

(a) rectifier means connected with the base electrodes and operative, whenever the base means is indeed inserted into the Edison-type lamp socket, to provide a DC voltage between a pair of DC terminals;

(b) inverter means connected with the DC terminals and operative to provide an AC inverter voltage from a pair of inverter terminals; the AC inverter voltage having a fundamental cycle period; the AC inverter voltage being further characterized by being of frequency distinctly higher than that of the AC power line voltage; the inverter means including a first transistor characterized by conducting current in its forward direction for but a brief period once during each fundamental cycle period; the duration of the brief period being distinctly shorter than half the duration of the fundamental cycle period.

17. The lamp assembly of claim 16 further characterized in that the inverter means includes a second transistor series-connected with the first transistor to form a series-combination, which series-combination is connected across the DC terminals.

18. The lamp assembly of claim 16 further characterized in that the absolute magnitude of the DC voltage is distinctly higher than the peak absolute magnitude of the AC power line voltage.

* * * * *